(12) United States Patent
Timm et al.

(10) Patent No.: US 6,188,966 B1
(45) Date of Patent: Feb. 13, 2001

(54) RECONSTRUCTION OF MULTI-PHASE SIGNALS FROM REPETITIVE SAMPLES

(75) Inventors: Daniel P. Timm; Matthew S. Holcomb, both of Colorado Springs, CO (US)

(73) Assignee: Agilent Technologies, Palo Alto, CA (US)

( * ) Notice: Under 35 U.S.C. 154(b), the term of this patent shall be extended for 0 days.

(21) Appl. No.: 09/021,635

(22) Filed: Feb. 10, 1998

(51) Int. Cl.[7] .......................... G01R 13/02; G06F 19/00; G09G 5/00
(52) U.S. Cl. .............................. 702/67; 345/134
(58) Field of Search ................... 702/66, 67, 68, 702/16, 70, 71, 73, 189, 193, 69, 79, FOR 157, 169, 124, 125, 126; 324/76.39, 76.15, 76.24, 76.38, 76.42, 76.58; 345/134; 700/73, 74

(56) References Cited

U.S. PATENT DOCUMENTS 4,455,613 * 6/1984 Shoemaker ........................ 324/76.15

FOREIGN PATENT DOCUMENTS

2155738 * 9/1985 (EP) ................................ G09G/1/16

* cited by examiner

Primary Examiner—Marc S. Hoff
Assistant Examiner—Manuel L. Barbee
(74) Attorney, Agent, or Firm—Augustus W. Winfield

(57) ABSTRACT

A method of connecting displayed samples of a signal, where the samples are obtained by sequential or random repetitive sampling. Three example embodiments are presented. In a first embodiment, the system decides whether or not to connect to the next consecutive sample, based on the outcome of comparison of the magnitude of the slope to a slew rate threshold. In the second embodiment, the system looks ahead (or behind) up to M samples to see if any samples represent valid slew rates, and connects to the first sample representing a valid slew rate. In the third embodiment, the system looks ahead (or behind) M samples and connects to the sample in the next M samples that represents the smallest valid slew rate. In each embodiment, if no sample represents a valid slew rate, no connection is drawn. In the second and third example embodiments, by looking ahead (or behind) M samples, the system can potentially resolve a waveform with up to M phases and can accommodate trigger placement uncertainty.

13 Claims, 4 Drawing Sheets

US 6,188,966 B1

RECONSTRUCTION OF MULTI-PHASE SIGNALS FROM REPETITIVE SAMPLES

FIELD OF INVENTION

This invention relates generally to electronic instrumentation for signal sampling, such as digital oscilloscopes, and more specifically to connection of samples for display of waveforms where the samples are taken during repetitive sampling.

BACKGROUND OF THE INVENTION

Digital oscilloscopes (and other digital signal acquisition instruments) sample analog input signal voltages, convert each analog sample to a digital value with an analog-to-digital converter, store the digital sample values in a memory for processing, and display the processed digital sample values. A waveform record is a one dimensional array of digital sample values. Typically, the array is a time ordered list, with a fixed time increment between adjacent samples. Modern digital oscilloscopes typically have three sampling methods for acquiring a waveform and filling in the waveform record: single-shot sampling, sequential repetitive sampling, and random repetitive sampling.

In single-shot sampling (also called real time sampling), an entire waveform record is captured from one trigger event. Enough samples occur within the time interval of interest to adequately represent the analog signal that was sampled. The time between adjacent samples is the reciprocal of the sample rate.

In sequential repetitive sampling, one sample is typically captured from each trigger event. The time from the trigger event to the sample is typically incremented by a small amount for each subsequent trigger event. The waveform record is filled sequentially in time order, requiring one trigger for each record entry. The time between adjacent samples in the waveform record is much shorter than the reciprocal of the sample rate.

In random repetitive sampling, multiple samples are captured from each trigger event, but not enough to fill the waveform record. The samples are taken at random times with respect to the trigger event. The time from the trigger event to each sample is accurately measured and each sample is placed at the proper time slot in the waveform record. With multiple trigger events, the waveform record is gradually filled. The time between adjacent samples in the waveform record is much shorter than the reciprocal of the sample rate.

When a waveform record is drawn or displayed, individual samples may be represented simply as dots or pixels. Alternatively, it is often useful to connect dots. One straightforward algorithm for connecting dots is to simply connect the dot for sample (N) to the dot for sample (N+1). For single-phase waveforms, for example a sine wave or a square wave, simple sequential connection of dots enhances the display. However, some waveforms are multi-phase. That is, they may have multiple values at a given delay time from a trigger event. One common example is the output of a digital gate that at a given delay from a clock edge may have a voltage corresponding to a logical one or a voltage corresponding to a logical zero. For sequential repetitive sampling or random repetitive sampling, sample (N) may come from a different trigger event than sample (N+1). Therefore, for example, sample (N) may be from a logical one state and sample (N+1) may be from a logical zero state. A human observer viewing just dots or pixels is capable of appropriately interpreting the two separate states. However, simply connecting adjacent record values, where adjacent record values randomly represent one of two states, can result in a chaotic display. There is a need for an improved method of connecting samples of multi-phase signals when drawing or displaying samples from sequential or random repetitive samples.

SUMMARY OF THE INVENTION

The system has an inherent limit, called the maximum slew rate (volts/second), on the rate of change of an input signal that can be accurately sampled. The system (hardware or software) compares the slope of a connection between two samples to a slope corresponding to the maximum slew rate. If a connection exceeds the maximum slew rate, the connection is not drawn.

Three example embodiments are presented. In a first example embodiment, the system decides whether or not to connect to the next (or previous) consecutive sample, based on the outcome of comparison of the magnitude of the slope to a slew rate threshold. In the second example embodiment, the system looks ahead (or behind) up to M samples to see if any samples represent valid slew rates, and connects to the first sample representing a valid slew rate (or does not draw a connection if no sample represents a valid slew rate). In the third example embodiment, the system looks ahead (or behind) M samples and connects to the sample in the next M samples that represents the smallest valid slew rate (or does not draw a connection if no sample represents a valid slew rate). In each example embodiment, if no sample represents a valid slew rate, no connection is drawn. Direction of connecting is arbitrary. That is, the system may connect "forward" in time by looking at subsequent samples or "backward" in time by looking at previous samples.

The maximum slew rate number may be adjusted to compensate for noise, possibly increasing the number of misconnections but decreasing the number of situations in which no connection is drawn where a connection should be drawn. In the second and third example embodiments, by looking ahead (or behind) M samples, the system can potentially resolve a waveform with up to M phases and can accommodate trigger placement uncertainty. When looking ahead or behind multiple samples, the threshold may be made a function of the time between samples (as measured in the waveform record).

DETAILED DESCRIPTION OF THE PREFERRED EMBODIMENT OF THE INVENTION

Figure 1A:
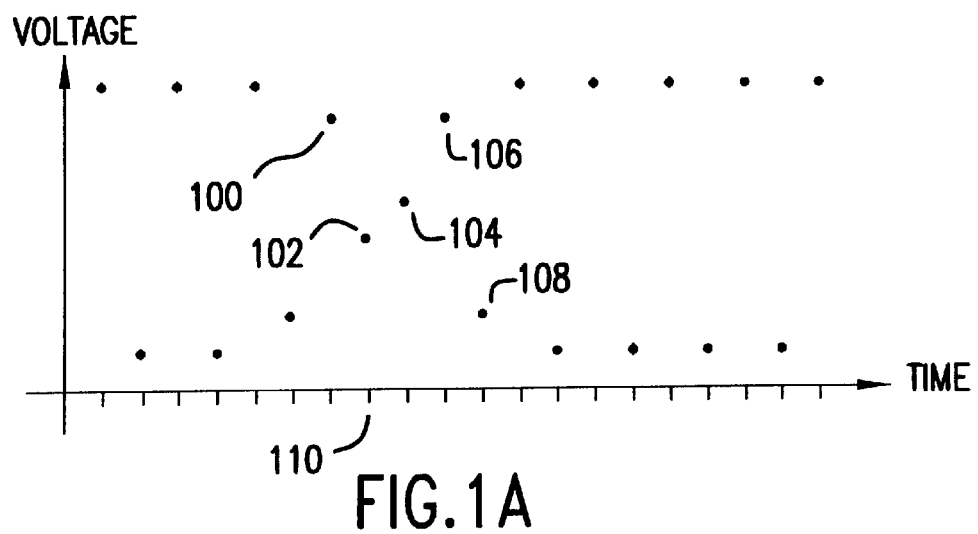
FIG. 1A is a graph of voltage as a function of time illustrating individual unconnected samples from a waveform record resulting from repetitive sampling of a multi-phase signal.

FIG. 1A is a graph of voltage as a function of time illustrating individual unconnected samples (for example, 100–108) from a waveform record resulting from sequential sampling of a multi-phase signal. Each tic mark 110 on the time axis represents an entry location in a waveform record. Each sample point represents the numerical value contained in the corresponding location in the waveform record. As will be discussed in more detail below, the waveform record depicted in FIG. 1A is somewhat idealized.

Figure 1B:
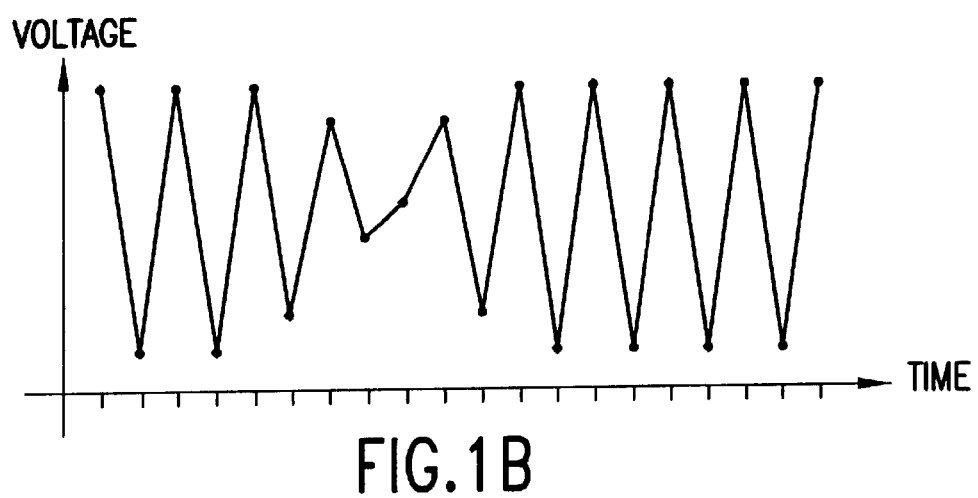
FIG. 1B is the graph of FIG. 1A with adjacent samples connected.

FIG. 1B is the graph of FIG. 1A with the samples connected by simply connecting sample N to sample N+1. The resulting display is not as useful as displays in accordance with the example embodiments of the invention discussed below.

Figure 1C:
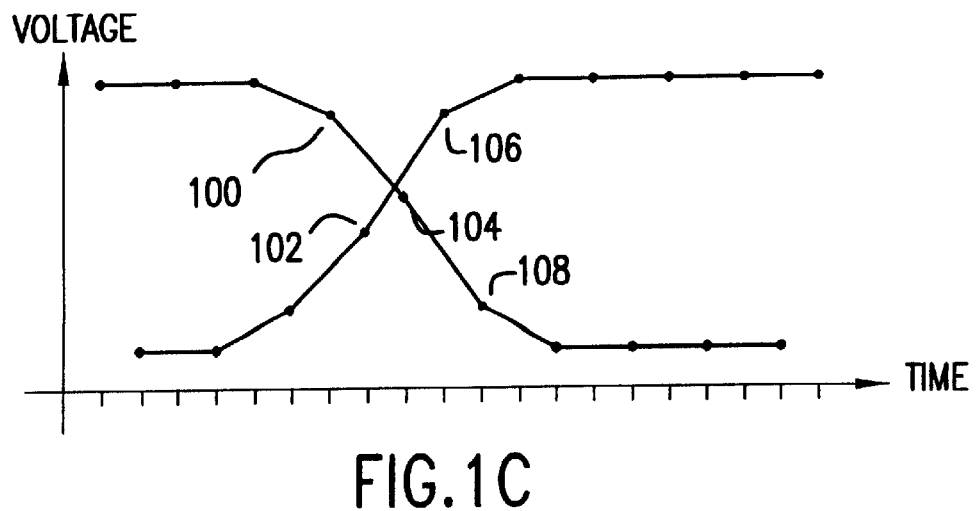
FIG. 1C is the graph of FIG. 1A with samples connected in accordance with the invention.

FIG. 1C is the graph of FIG. 1A with the samples connected in accordance with the invention. The resulting graph clearly indicates the two-phase nature of the sampled signal.

Any electronic signal sampling system has some finite maximum slew rate. The input amplifiers have a finite bandwidth, analog samplers have some finite sample time, and so forth. Even though samples for repetitive samples come from different trigger events, samples along a repetitive waveform still capture a finite system response time that is a function of the time represented by adjacent waveform record entries. Repetitive sampling is typically performed only at the fastest sweep speeds. For slower sweep speeds, single shot sampling is used. As the sweep speed increases, at some sweep speed, the system physically cannot respond to voltage changes from the maximum value to the minimum value (or vice-versa) in the time delta represented by adjacent record elements. The system can be tested by providing an input test signal with a step function having a rise or fall time that exceeds the maximum slew rate of the system. Preferably, the test signal magnitude should approximately cover the entire range of the analog-to-digital converters. Measurements bracketing the midpoint (for example, +/−10% or +/−20% of full scale) of a rising or falling edge provide a measure of the maximum slew rate of the system. This slew rate may then be translated into a maximum change in analog-to-digital converter counts for the time period represented by adjacent waveform record entries. In the second and third example embodiments discussed below, the maximum slew rate can be adjusted to compensate for the fact that samples being compared are not adjacent within the waveform record.

In a first example method of connecting samples in accordance with the invention, adjacent waveform record entries are connected if the magnitude of the rate of change is less than the maximum slew rate. Otherwise, no connection is made and the connected line is broken. If no connections are made on either side of a sample, the sample is displayed as a dot. Adjacent waveform record entries having a rate of change greater than the maximum slew rate likely represent samples from different phases of a multi-phase signal, and therefore should not be connected. In FIG. 1C, the slope of the line from sample 100 to sample 102 is higher than the slope of the line from sample 100 to sample 104. With an appropriate slew rate threshold, the system would choose to not connect sample 100 to sample 102.

The samples depicted in FIG. 1A are somewhat idealized. In a real system, there are at least three characteristics that may cause a simple slew rate threshold calculation (as in the first example method) to misconnect or to inappropriately fail to connect.

One real system characteristic is noise resulting in a small amount of randomness in the vertical position of the samples in FIG. 1A. Slightly increasing the threshold above the maximum slew rate causes a slight increase in misconnections, but helps prevent a failure to connect samples that should be connected.

A second real system characteristic is uncertainty in the time of a sample within the time window defined by an entry in the waveform record. Each entry in the waveform record represents a time window equal to the overall time of the record divided by the number of entries in the record. For some sweep speeds, the resolution for a sample time may be much less than the time window defined by an entry in the waveform record. That is, a sample may occur at the beginning of the time window of a waveform record entry, at the end of the entry, or somewhere in between. Assume, for example, the resolution within an entry time T is n. For adjacent entries, if a very late sample is followed by a very early sample, the assumed time for computing slope is T when the time may actually be T/n. If a very early sample is followed by a very late sample, the assumed time for computing slope is T when the time may actually be (2T−T/n). Therefore, the time between samples may range from T/n to (2T−T/n). Therefore, the measured slope may be approximately twice the actual slope. Again, the threshold may be increased, to almost twice the maximum slew rate if necessary, causing a slight increase in misconnections, but helping prevent failures to connect samples that should be connected.

The third real system characteristic is uncertainty in trigger placement. For typical real systems, trigger variations may cause a sample to be placed into the wrong entry within the waveform record. As a result, a monotonic signal may not result in a monotonic waveform record. For example, if the input signal is the rising edge of a pure sine wave, the resulting adjacent entries in the waveform record should increase monotonically. However, due to finite uncertainty in trigger placement from one trigger to the next, combined with sample noise and uncertainty in the time of the sample, the resulting waveform record may have a sample that is numerically larger than the next consecutive sample in the record. This results in further distortion of measured skews, possibly causing misconnections or lack of a connection where a connection should occur.

One approach to all the real system characteristics is to look ahead (or behind) up to M samples to see if any represent valid slew rates, and picking one that represents a valid slew rate, if one exists. The second and third example methods of connecting in accordance with the invention look beyond the adjacent sample. In the second example method, a sample is connected to the first unconnected sample representing a valid slew rate, if any. In the third example method, a sample is connected to the unconnected sample representing the slew rate having the smallest valid magnitude, if any. From empirical data, the third example method tends to result in more appropriate choices. When looking ahead or behind M samples, the threshold for determining a valid slew rate may be adjusted based on the time between samples. That is, if the time between adjacent samples in the waveform record is assumed to be T and the slew rate threshold for determining a valid sample is based on a time delta of T, when the system looks ahead or behind 2 samples the slew rate threshold may be based on a time of 2T, and so forth.

Consider FIG. 1C, and assume the system has connected to point 100 and is deciding the next connection. Depending on the slew rate threshold, sample 102 may provide a valid slew rate. Therefore, the second method might connect sample 100 to sample 102. For the third method, with M=2, the magnitude of the slope from sample 100 to sample 104 is smaller than the magnitude of the slope from sample 100 to sample 102, so in the third method, sample 100 is connected to sample 104. In addition, connecting sample 100 to sample 104 prevents an inappropriate connection from sample 102 to sample 104. FIG. 1C is drawn using the third method with M=2. Note that the number M may need to be under operator control, based on the expected signal characteristics. In FIG. 1C, with M=3, the third method may result in the system choosing to inappropriately connect sample 100 to sample 106.

Figure 2:
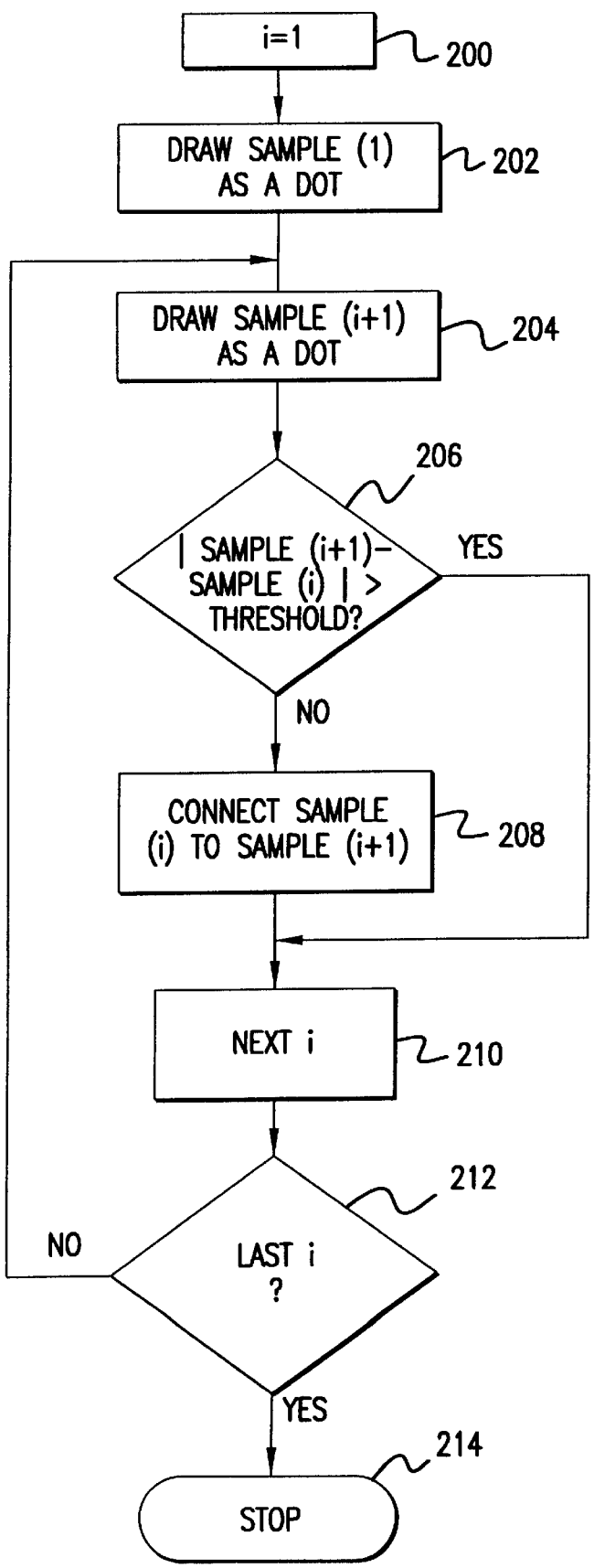
FIG. 2 is a flow chart illustrating a method in accordance with an example embodiment of the invention.

FIG. 2 is a flow chart of the first example method. In FIG. 2, processing proceeds from the first sample (i=1, step 200) to the last sample. Direction is arbitrary and processing could just as easily proceed from the last sample to the first sample. In FIG. 2, starting with the first sample, samples are first drawn as dots (steps 202 and 204). Note, for simplicity of illustration, at step 204 dots for samples may be redrawn even though they may already be connected. At step 206, the magnitude of the difference between a sample and the next sample is measured. Note that time does not have to explicitly included. Instead, the threshold is scaled to correspond to the time range represented by one entry in the waveform record. If the magnitude of the difference is less than or equal to the threshold, a connection is drawn (step 208). If the magnitude of the difference is greater than the threshold then no connection is drawn. These steps are repeated for all samples (steps 210, 212 and 214).

Figure 3:
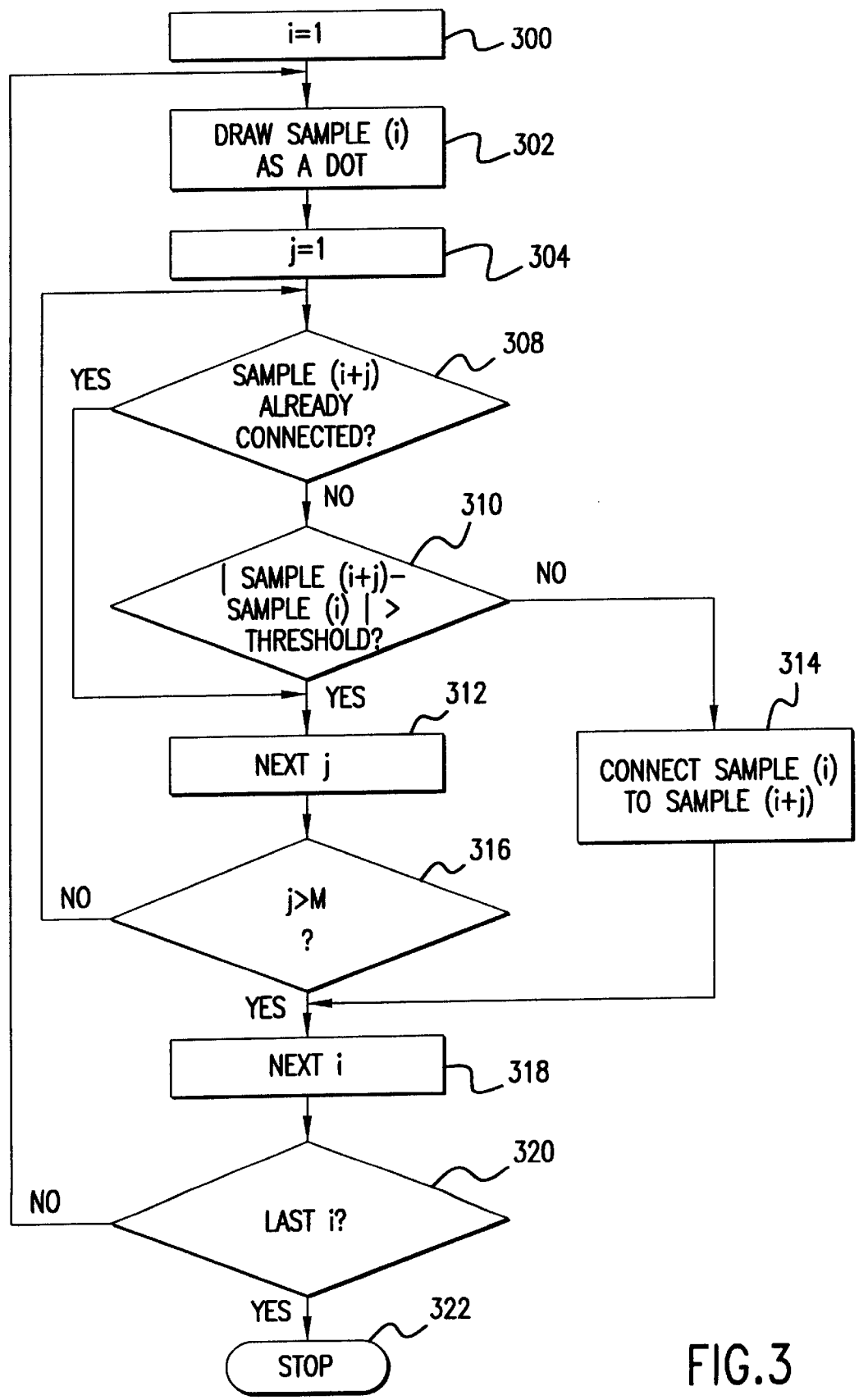
FIG. 3 is a flow chart illustrating a method in accordance with a second example embodiment of the invention.

FIG. 3 is a flow chart of the second example method. In FIG. 3, up to M samples are investigated for possible connection. In FIG. 3, processing proceeds from the first sample to the last sample. Direction is arbitrary and processing could just as easily proceed from the last sample to the first sample. After initialization (step 300), each sample is drawn as a dot (step 302). At steps 308 and 310, two samples are investigated. If the next sample is unconnected (test 308), the magnitude of the difference between a first sample (i) and a next sample (i+j) is measured (step 310). Each difference magnitude is compared to a threshold. A single predetermined threshold may be used. Preferably, however, there are multiple predetermined thresholds, one threshold for each of the various possible time periods between the samples to be connected. That is, if the time between adjacent samples in the waveform record is assumed to be T, when the system looks ahead or behind 2 samples the slew rate threshold may be based on a time of 2T, and so forth. If the magnitude of the difference is less than or equal to the appropriate threshold, a connection is drawn (step 314). Otherwise, the connection test and magnitude comparison is computed again for additional values of j (steps 312 and 316) and so forth until either a sample is connected or until M samples have been investigated. If no one of the M later samples satisfies the criteria, sample (i) may not be connected to one of the M later samples. There may be a break in the connected dots, and one or more dots may be left unconnected. Note that connections may stop short of the end of the waveform record, or the waveform record may be extended by padding the last value to permit the algorithm to connect the last point.

Figure 4:
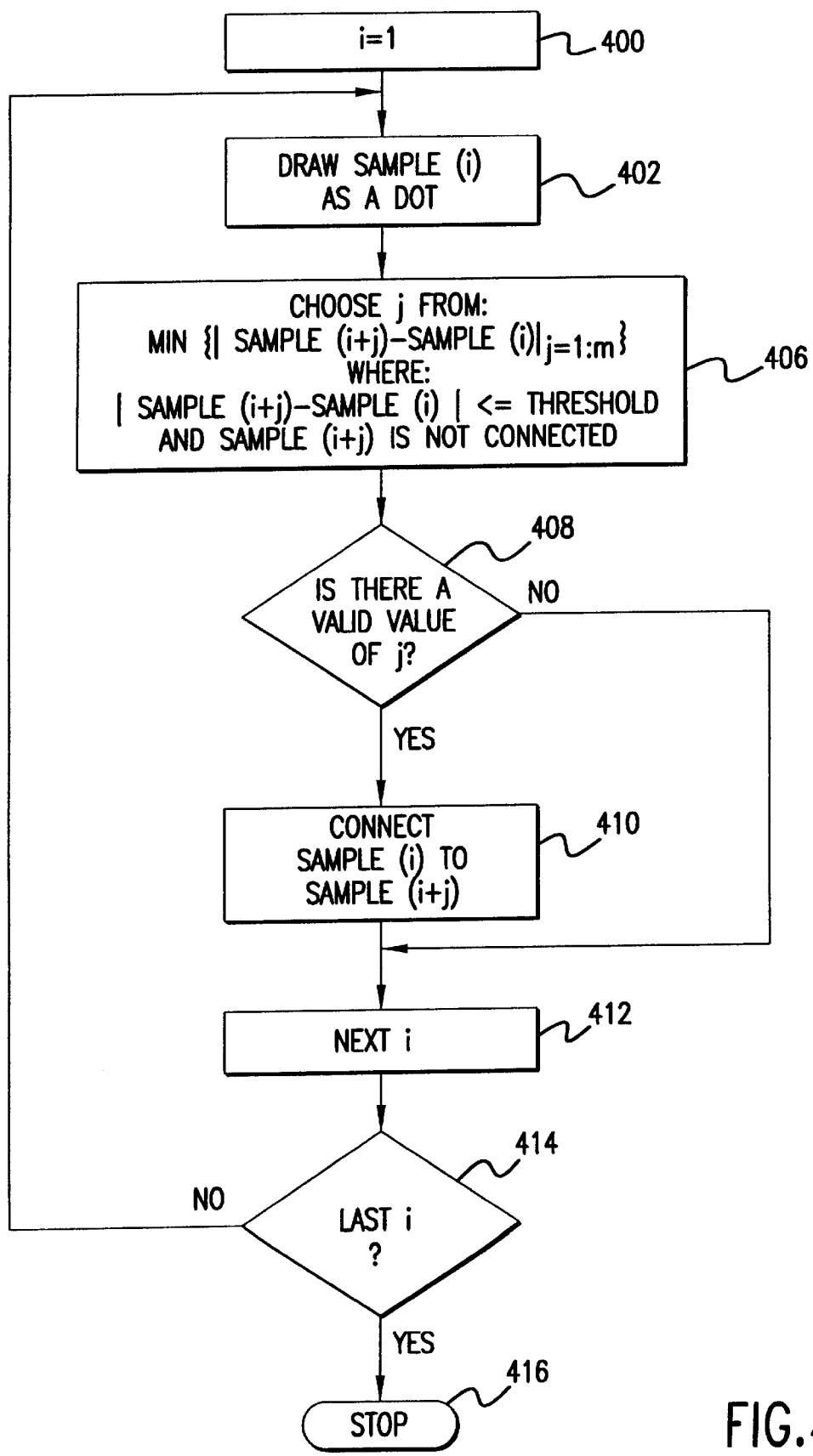
FIG. 4 is a flow chart illustrating a method in accordance with a third example embodiment of the invention.

FIG. 4 is a flow chart of the third example method. In FIG. 4, up to M samples are investigated for possible connection. In FIG. 4, processing proceeds from the first sample to the last sample. Direction is arbitrary and processing could just as easily proceed from the last sample to the first sample. After initialization (step 400), each sample is drawn as a dot (step 402. At step 406, the magnitude of the difference between a starting sample and each of M subsequent samples is computed (j=1 to M). Each difference magnitude is compared to a threshold. A single predetermined threshold may be used. Preferably, however, there are multiple predetermined thresholds, one threshold for each of the various possible time periods between the samples to be connected. That is, if the time between adjacent samples in the waveform record is assumed to be T, when the system looks ahead or behind 2 samples the slew rate threshold may be based on a time of 2T, and so forth. If at least one value of j satisfies the threshold criteria and sample (i+j) is not connected (that is, the resulting set is not null, test 408), the minimum difference magnitude is selected from the set and the starting sample (i) is connected to the sample (i+j) corresponding to the minimum magnitude difference (step 410). If no one of the M later samples satisfies the criteria, sample (i) may not be connected to one of the M later samples. There may be a break in the connected dots, and one or more dots may be left unconnected. Connections may stop short of the end of the waveform record, or the waveform record may be extended by padding the last value to permit the algorithm to connect the last point.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for connecting displayed samples of a waveform, wherein the waveform is plotted against a first-axis and a second-axis, the method comprising the following steps:

along one of said first-axis or said second-axis, computing the magnitude of the difference between a first sample and at least one additional sample other than the first sample;

comparing the magnitude to a threshold; and connecting the first sample to the additional sample only if said magnitude is less than said threshold.

2. The method of claim 1 where the additional sample is a subsequent adjacent sample.

3. The method of claim 1 where the additional sample is a previous adjacent sample.

4. The method of claim 1 where the threshold is predetermined.

5. The method of claim 1 where the threshold is a function of the time between the first sample and the additional sample.

6. The method of claim 1 where the first sample is connected to the nearest additional sample having a satisfactory comparison result.

7. The method of claim 6 where the first sample is connected to the additional sample only when there is no sample already connected to the additional sample.

8. A method for connecting displayed samples of a waveform, the method comprising the following steps:
   (a) computing the magnitude of the difference between a first sample and at least two additional samples;
   (b) comparing each of the magnitudes from step (a) to a threshold;
   (c) computing the minimum of the magnitudes in step (a) that satisfy a result of step (b); and
   (d) connecting the first sample to the additional sample that corresponds to the minimum of step (c).

9. The method of claim 8 where the additional samples are subsequent samples.

10. The method of claim 8 where the additional samples are previous samples.

11. The method of claim 8 where the threshold is predetermined.

12. The method of claim 8 where the threshold is a function of the time between the first sample and the additional sample being compared.

13. The method of claim 8 where the first sample is connected to the additional sample only when there is no sample already connected to the additional sample.

* * * * *